US009252151B2

(12) United States Patent
Chien et al.

(10) Patent No.: US 9,252,151 B2
(45) Date of Patent: *Feb. 2, 2016

(54) THREE DIMENSIONAL NAND DEVICE WITH BIRDS BEAK CONTAINING FLOATING GATES AND METHOD OF MAKING THEREOF

(71) Applicant: SANDISK TECHNOLOGIES INC., Plano, TX (US)

(72) Inventors: Henry Chien, San Jose, CA (US); Donovan Lee, Santa Clara, CA (US); Vinod R. Purayath, Santa Clara, CA (US); Yuan Zhang, San Jose, CA (US); James K. Kai, Santa Clara, CA (US); George Matamis, San Jose, CA (US)

(73) Assignee: SANDISK TECHNOLOGIES INC., Plano, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/183,152

(22) Filed: Feb. 18, 2014

(65) Prior Publication Data

US 2015/0008505 A1    Jan. 8, 2015

Related U.S. Application Data

(60) Provisional application No. 61/843,835, filed on Jul. 8, 2013, provisional application No. 61/845,038, filed on Jul. 11, 2013.

(51) Int. Cl.
*H01L 27/115* (2006.01)
*H01L 27/06* (2006.01)
(Continued)

(52) U.S. Cl.
CPC ...... *H01L 27/11556* (2013.01); *H01L 27/0688* (2013.01); *H01L 27/1157* (2013.01);
(Continued)

(58) Field of Classification Search
None
See application file for complete search history.

(56) References Cited

U.S. PATENT DOCUMENTS

| 5,084,417 A | 1/1992 | Joshi et al. |
| 5,807,788 A | 9/1998 | Brodsky et al. |

(Continued)

FOREIGN PATENT DOCUMENTS

| JP | 2009-289950 A | 12/2009 |
| WO | WO02/15277 A2 | 2/2002 |
| WO | WO 2012/052298 A1 | 4/2012 |

OTHER PUBLICATIONS

International Search Report and written Opinion received in connection with international application No. PCT/US2014/045347; mailed Oct. 2, 2014.

(Continued)

*Primary Examiner* — Pamela E Perkins
(74) *Attorney, Agent, or Firm* — The Marbury Law Group PLLC

(57) ABSTRACT

A method of making a monolithic three dimensional NAND string including forming a stack of alternating layers of a first material and a second material over a substrate. The first material comprises an electrically insulating material and the second material comprises a semiconductor or conductor material. The method also includes etching the stack to form a front side opening in the stack, forming a blocking dielectric layer over the stack of alternating layers of a first material and a second material exposed in the front side opening, forming a semiconductor or metal charge storage layer over the blocking dielectric, forming a tunnel dielectric layer over the charge storage layer, forming a semiconductor channel layer over the tunnel dielectric layer, etching the stack to form a back side opening in the stack, removing at least a portion of the first material layers and portions of the blocking dielectric layer.

33 Claims, 5 Drawing Sheets

(51) Int. Cl.
*H01L 29/788* (2006.01)
*H01L 29/792* (2006.01)
*H01L 29/66* (2006.01)

(52) U.S. Cl.
CPC .... *H01L27/11551* (2013.01); *H01L 27/11582* (2013.01); *H01L 29/66825* (2013.01); *H01L 29/7889* (2013.01); *H01L 29/7926* (2013.01)

(56) References Cited

U.S. PATENT DOCUMENTS

| | | | |
|---|---|---|---|
| 5,915,167 | A | 6/1999 | Leedy |
| 7,177,191 | B2 | 2/2007 | Fasoli et al. |
| 7,221,588 | B2 | 5/2007 | Fasoli et al. |
| 7,233,522 | B2 | 6/2007 | Chen et al. |
| 7,514,321 | B2 | 4/2009 | Mokhlesi et al. |
| 7,575,973 | B2 | 8/2009 | Mokhlesi et al. |
| 7,745,265 | B2 | 6/2010 | Mokhlesi et al. |
| 7,745,312 | B2 | 6/2010 | Herner et al. |
| 7,808,038 | B2 | 10/2010 | Mokhlesi et al. |
| 7,848,145 | B2 | 12/2010 | Mokhlesi et al. |
| 7,851,851 | B2 | 12/2010 | Mokhlesi et al. |
| 8,008,710 | B2 | 8/2011 | Fukuzumi |
| 8,053,829 | B2 | 11/2011 | Kang et al. |
| 8,187,936 | B2 | 5/2012 | Alsmeier et al. |
| 8,193,054 | B2 | 6/2012 | Alsmeier |
| 8,198,672 | B2 | 6/2012 | Alsmeier |
| 8,283,228 | B2 | 10/2012 | Alsmeier |
| 8,349,681 | B2 | 1/2013 | Alsmeier et al. |
| 2007/0210338 | A1 | 9/2007 | Orlowski |
| 2007/0252201 | A1 | 11/2007 | Kito et al. |
| 2009/0230458 | A1 | 9/2009 | Ishiduki et al. |
| 2009/0283819 | A1 | 11/2009 | Ishikawa et al. |
| 2010/0044778 | A1 | 2/2010 | Seol |
| 2010/0059811 | A1 | 3/2010 | Sekine et al. |
| 2010/0112769 | A1 | 5/2010 | Son et al. |
| 2010/0120214 | A1 | 5/2010 | Park et al. |
| 2010/0155810 | A1 | 6/2010 | Kim et al. |
| 2010/0155818 | A1 | 6/2010 | Cho |
| 2010/0163968 | A1 | 7/2010 | Kim et al. |
| 2010/0181610 | A1 | 7/2010 | Kim et al. |
| 2010/0207195 | A1 | 8/2010 | Fukuzumi |
| 2010/0320528 | A1 | 12/2010 | Jeong et al. |
| 2011/0018047 | A1 | 1/2011 | Komiya |
| 2011/0076819 | A1 | 3/2011 | Kim et al. |
| 2011/0133606 | A1 | 6/2011 | Yoshida et al. |
| 2011/0266606 | A1 | 11/2011 | Park et al. |
| 2012/0001247 | A1 | 1/2012 | Alsmeier |
| 2012/0001249 | A1 | 1/2012 | Alsmeier |
| 2012/0083077 | A1 | 4/2012 | Yang et al. |
| 2012/0142180 | A1 | 6/2012 | Matsushita et al. |
| 2012/0256247 | A1 | 10/2012 | Alsmeier |
| 2013/0161726 | A1 | 6/2013 | Kim et al. |
| 2013/0248974 | A1 | 9/2013 | Alsmeier et al. |
| 2013/0264631 | A1 | 10/2013 | Alsmeier et al. |
| 2013/0313627 | A1 | 11/2013 | Lee et al. |
| 2014/0008714 | A1 | 1/2014 | Makala et al. |

OTHER PUBLICATIONS

Jang et al., "Vertical Cell Array Using TCAT (Terabit Cell Array Transistor) Technology for Ultra High Density NAND Flash Memory," 2009 Symposium on VLSI Technology Digest of Technical Papers, pp. 192-193.

Katsumata et al., "Pipe-Shaped BiCS Flash Memory with 16 Stacked Layers and Multi-Level-Cell Operation for Ultra High Density Storage Devices," 2009 Symposium on VLSI Technology Digest of Technical Papers, pp. 136-137.

Maeda et al., "Multi-Stacked 1G Cell/Layer Pipe-Shaped BiCS Flash Memory," 2009 Symposium on VLSI Technology Digest of Technical Papers, pp. 22-23.

Endoh et al., "Novel Ultra High Density Memory with a Stacked-Surrounding Gate Transistor (S-SGT) Structured Cell," IEDM Proc. (2001) 33-36.

Tanaka et al., "Bit-Cost Scalable Technology for Low-Cost and Ultrahigh-Density Flash Memory," Toshiba Review, vol. 63, No. 2, 2008, pp. 28-31.

Masahide Kimura, "3D Cells Make Terabit NAND Flash Possible," Nikkei Electronics Asia, Sep. 17, 2009, 6pgs.

International Search Report & Written Opinion, PCT/US2011/042566, Jan. 17, 2012.

Invitation to Pay Additional Fees & Partial International Search Report, PCT/US2011/042566, Sep. 28, 2011.

Jang et al., "Memory Properties of Nickel Silicide Nanocrystal Layer for Possible Application to Nonvolatile Memory Devices," IEEE Transactions on Electron Devices, vol. 56, No. 12, Dec. 2009.

Chen et al., "Reliability Characteristics of NiSi Nanocrystals Embedded in Oxide and Nitride Layers for Nonvolatile Memory Application," Applied Physics Letters 92, 152114 (2008).

J. Ooshita, Toshiba Announces 32Gb 3D-Stacked Multi-Level NAND Flash, 3 pages, http://techon.nikkeibp.co.jp/english/NEWS_EN/20090619/171977/ Nikkei Microdevices, Tech-On, Jun. 19, 2009.

Wang et al., "Low Temperature Silicon Selective Epitaxial Growth (SEG) and Phosphorous Doping in a Reduced-Pressure Pancake Reactor", ECE Technical Reports, Paper 299 (Apr. 1, 1992).

Whang et al., "Novel 3-Dimensional Dual Control-Gate with Surrounding Floating-Gate (DC-SF) NAND Flash Cell for 1Tb File Storage Application", IEDM-2010 Proceedings, Dec. 6-8, 2010, pp. 668-671.

U.S. Appl. No. 13/762,988, Makala et al., filed Feb. 8, 2013, "Three Dimensional NAND Device with Semiconductor, Metal or Silicide Floating Gates and Method of Making Thereof," Specification and drawings, 37pgs.

U.S. Appl. No. 14/133,979, Yada et al., filed Dec. 19, 2013, "Three Dimensional NAND Device with Channel Located on Three Sides of Lower Select Gate and Method of Making Thereof," Specification and drawings, 50pgs.

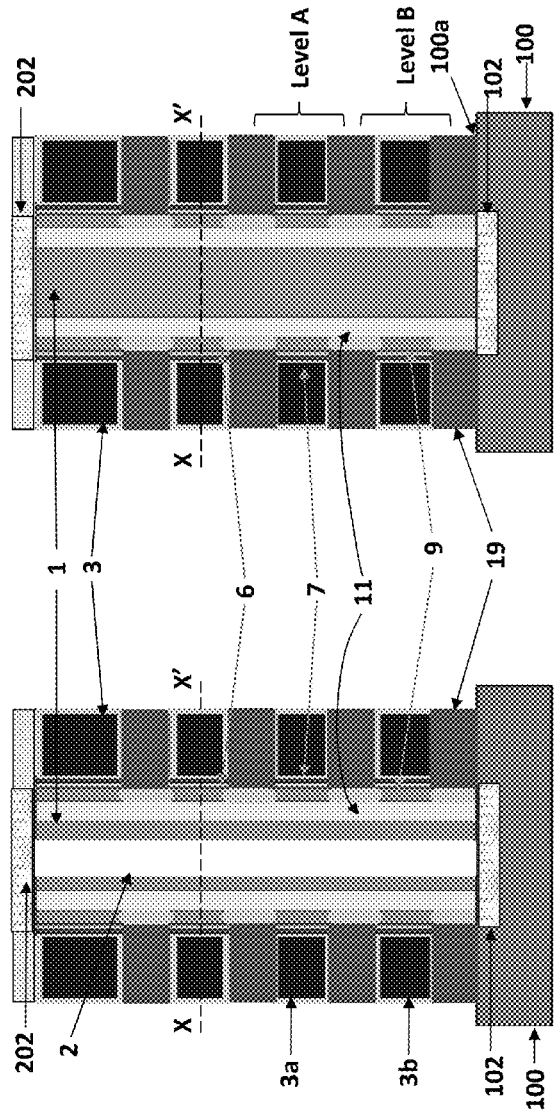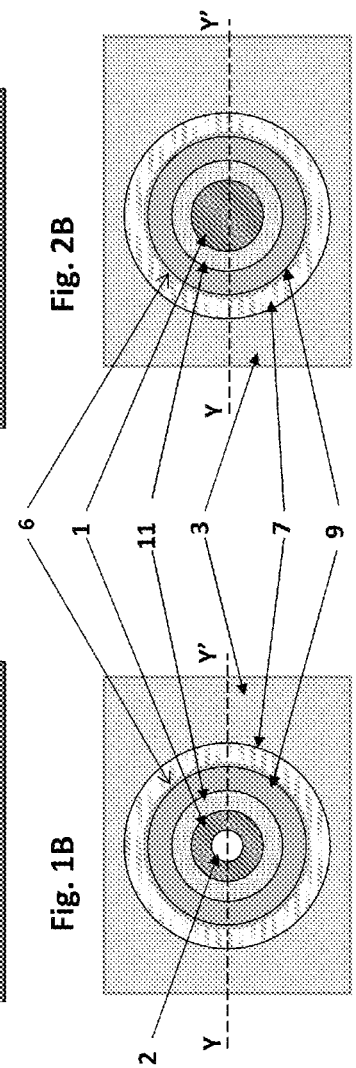

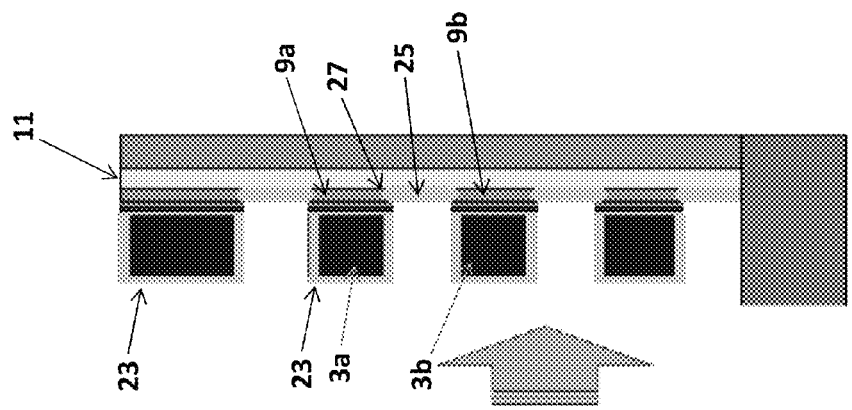
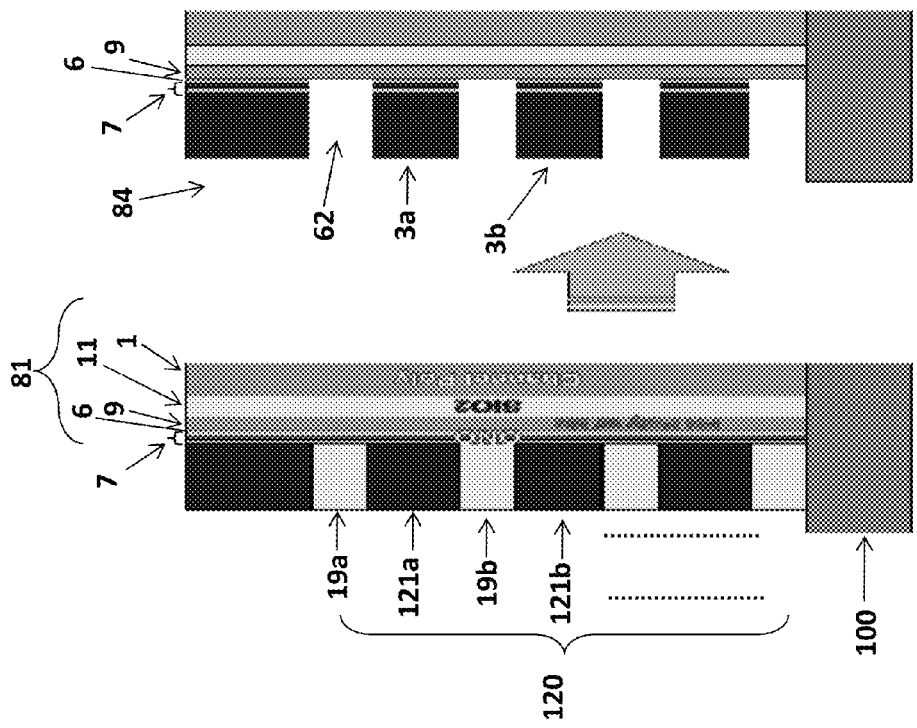

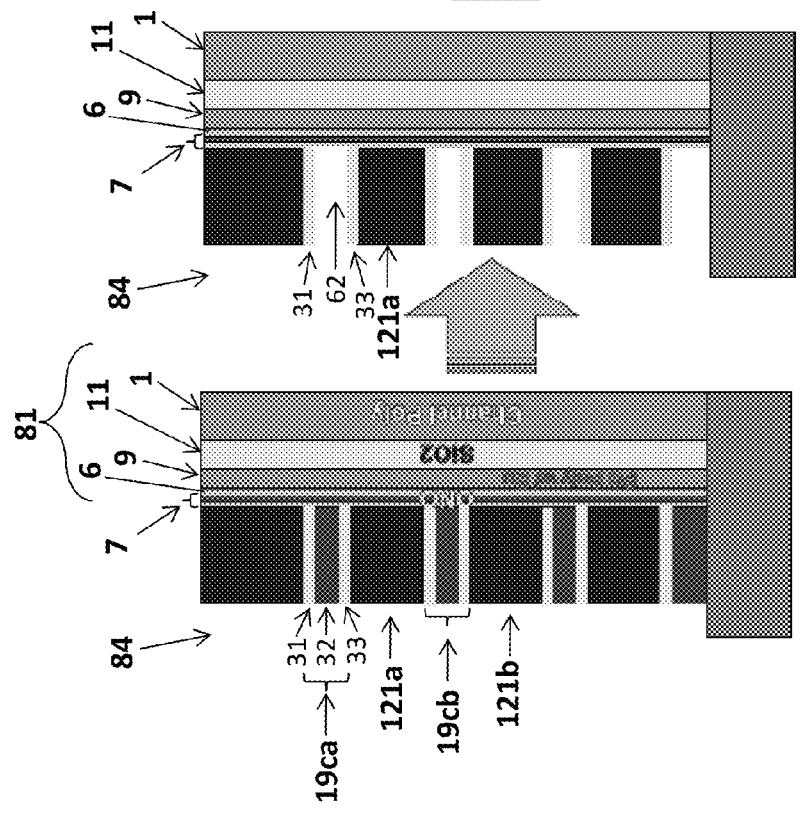

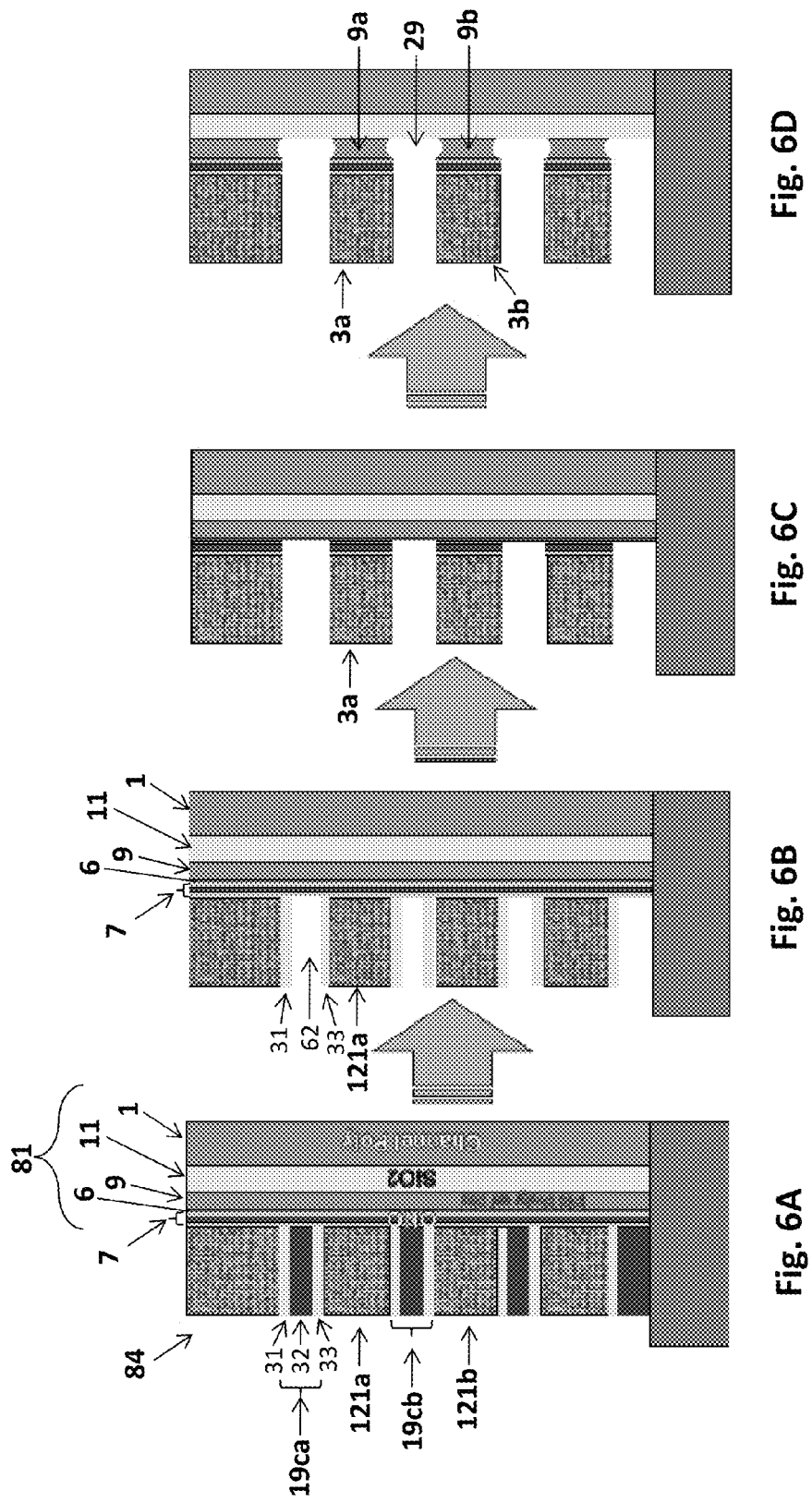

THREE DIMENSIONAL NAND DEVICE WITH BIRDS BEAK CONTAINING FLOATING GATES AND METHOD OF MAKING THEREOF

CROSS REFERENCE TO RELATED PATENT APPLICATION

This application claims the benefit of U.S. Provisional Application No. 61/843,835, filed Jul. 8, 2013 and U.S. Provisional Application No. 61/845,038, filed Jul. 11, 2013, the contents of which are hereby incorporated by reference in their entirety.

FIELD

The present invention relates generally to the field of semiconductor devices and specifically to three dimensional vertical NAND strings and other three dimensional devices and methods of making thereof.

BACKGROUND

Three dimensional vertical NAND strings are disclosed in an article by T. Endoh, et. al., titled "Novel Ultra High Density Memory With A Stacked-Surrounding Gate Transistor (S-SGT) Structured Cell", IEDM Proc. (2001) 33-36. However, this NAND string provides only one bit per cell. Furthermore, the active regions of the NAND string is formed by a relatively difficult and time consuming process involving repeated formation of sidewall spacers and etching of a portion of the substrate, which results in a roughly conical active region shape.

SUMMARY

An embodiment is drawn to a method of making a monolithic three dimensional NAND string including forming a stack of alternating layers of a first material and a second material over a substrate. The first material comprises an electrically insulating material and the second material comprises a semiconductor or conductor material. The method also includes etching the stack to form a front side opening in the stack, forming a blocking dielectric layer over the stack of alternating layers of a first material and a second material exposed in the front side opening, forming a semiconductor or metal charge storage layer over the blocking dielectric, forming a tunnel dielectric layer over the charge storage layer, forming a semiconductor channel layer over the tunnel dielectric layer, etching the stack to form a back side opening in the stack, removing at least a portion of the first material layers and portions of the blocking dielectric layer through the back side opening to form back side recesses between the second material layers and oxidizing regions of the charge storage layer adjacent the back side recesses to form discrete charge storage regions.

Another embodiment is drawn to a method of making a monolithic three dimensional NAND string including forming a stack of alternating first and second layers over a substrate. The first layers comprise an electrically insulating composite layer comprising a silicon nitride layer between silicon oxide layers and the second layers comprise a semiconductor or conductor material. The method also includes etching the stack to form a front side opening in the stack, forming a blocking dielectric layer over the stack of alternating first and second layers exposed in the front side opening, forming a charge storage layer over the layer of high work function material, forming a tunnel dielectric layer over the charge storage layer, forming a semiconductor channel layer over the tunnel dielectric layer, etching the stack to form a back side opening in the stack, removing at least a portion of the silicon nitride layer between silicon oxide layers to form back side recesses between adjacent second layers, removing portions of the blocking dielectric layer exposed in the back side recesses and forming discrete charge storage regions.

Another embodiment is drawn to a monolithic three dimensional NAND string including a semiconductor channel, at least one end portion of the semiconductor channel extending substantially perpendicular to a major surface of a substrate, a plurality of control gate electrodes extending substantially parallel to the major surface of the substrate. The plurality of control gate electrodes comprise at least a first control gate electrode located in a first device level and a second control gate electrode located in a second device level located over the major surface of the substrate and below the first device level. Also a blocking dielectric located in contact with the plurality of control gate electrodes, a plurality of vertically spaced apart charge storage regions located in contact with the blocking dielectric. The plurality of vertically spaced apart charge storage regions comprise at least a first spaced apart charge storage region located in the first device level and a second spaced apart charge storage region located in the second device level and a portion of the first and second charge storage regions comprises a bird's beak shape. And a tunnel dielectric located between each one of the plurality of the vertically spaced apart charge storage regions and the semiconductor channel.

Another embodiment is drawn to a method of making a monolithic three dimensional NAND string including forming a stack of alternating layers of a first material and a second material over a substrate. The first material comprises an electrically insulating material and the second material comprises a semiconductor or conductor material. Also, etching the stack to form a front side opening in the stack, forming a blocking dielectric layer over the stack of alternating layers of a first material and a second material exposed in the front side opening, forming a charge storage layer over the blocking dielectric, forming a tunnel dielectric layer over the charge storage layer, forming a semiconductor channel layer over the tunnel dielectric layer, etching the stack to form a back side opening in the stack, removing at least a portion of the first material layers through the back side opening to form back side recesses between the second material layers, forming a protective layer on portions of the second material layers exposed in the back side recesses, after forming the protective layer, removing portions of the blocking dielectric layer exposed in the back side the recesses through the back side opening and forming discrete charge storage regions.

BRIEF DESCRIPTION OF THE DRAWINGS

FIGS. 1A-1B are respectively side cross sectional and top cross sectional views of a NAND string of one embodiment. FIG. 1A is a side cross sectional view of the device along line Y-Y' in FIG. 1B, while FIG. 1B is a side cross sectional view of the device along line X-X' in FIG. 1A.

FIGS. 2A-2B are respectively side cross sectional and top cross sectional views of a NAND string of another embodiment. FIG. 2A is a side cross sectional view of the device along line Y-Y' in FIG. 2B, while FIG. 2B is a side cross sectional view of the device along line X-X' in FIG. 2A.

FIGS. 4A-4C, 5A-5D and 6A-6D are side cross sectional views illustrating embodiments of methods of making the NAND strings illustrated in FIGS. 1-3.

DETAILED DESCRIPTION

Figure 3:
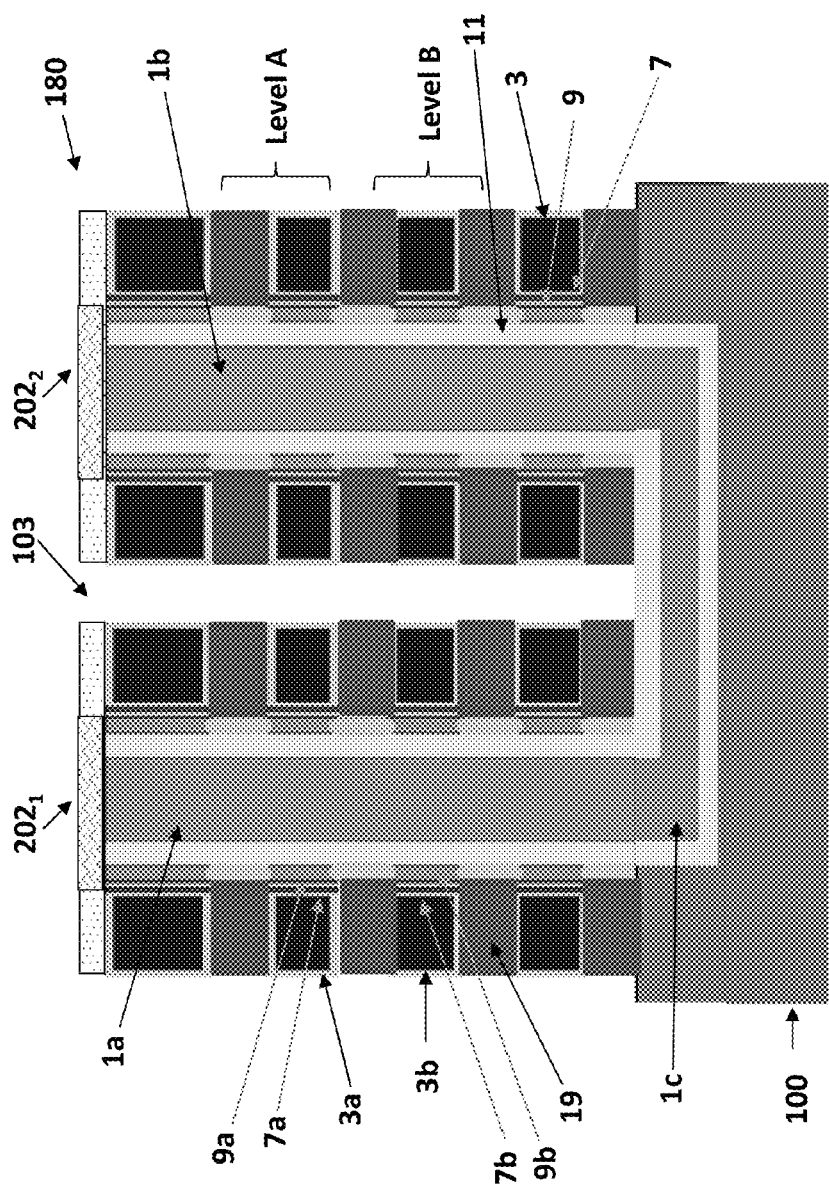
FIG. 3 is side cross sectional view of a NAND string of an embodiment with a U-shaped channel.

The embodiments of the invention provide a monolithic, three dimensional array of memory devices, such as an array of vertical NAND strings having selectively formed, discreet metal, semiconductor or silicide charge storage regions. The NAND strings are vertically oriented, such that at least one memory cell is located over another memory cell. The array allows vertical scaling of NAND devices to provide a higher density of memory cells per unit area of silicon or other semiconductor material.

A monolithic three dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and adhering the memory levels atop each other, as in Leedy, U.S. Pat. No. 5,915,167, titled "Three Dimensional Structure Memory." The substrates may be thinned or removed from the memory levels before bonding, but as the memory levels are initially formed over separate substrates, such memories are not true monolithic three dimensional memory arrays.

In some embodiments, the monolithic three dimensional NAND string 180 comprises a semiconductor channel 1 having at least one end portion extending substantially perpendicular to a major surface 100a of a substrate 100, as shown in FIGS. 1A and 2A. For example, the semiconductor channel 1 may have a pillar shape and the entire pillar-shaped semiconductor channel extends substantially perpendicularly to the major surface of the substrate 100, as shown in FIGS. 1A and 2A. In these embodiments, the source/drain electrodes of the device can include a lower electrode 102 provided below the semiconductor channel 1 and an upper electrode 202 formed over the semiconductor channel 1, as shown in FIGS. 1A and 2A. Alternatively, the semiconductor channel 1 may have a U-shaped pipe shape, as shown in FIG. 3. The two wing portions 1a and 1b of the U-shaped pipe shape semiconductor channel may extend substantially perpendicular to the major surface 100a of the substrate 100, and a connecting portion 1c of the U-shaped pipe shape semiconductor channel 1 connects the two wing portions 1a, 1b extends substantially parallel to the major surface 100a of the substrate 100. In these embodiments, one of the source or drain electrodes $202_1$ contacts the first wing portion of the semiconductor channel from above, and another one of a source or drain electrodes $202_2$ contacts the second wing portion of the semiconductor channel 1 from above. An optional body contact electrode (not shown) may be disposed in the substrate 100 to provide body contact to the connecting portion of the semiconductor channel 1 from below. The NAND string's select or access transistors are not shown in FIGS. 1-3 for clarity.

In some embodiments, the semiconductor channel 1 may be a filled feature, as shown in FIGS. 2A-2B and 3. In some other embodiments, the semiconductor channel 1 may be hollow, for example a hollow cylinder filled with an insulating fill material 2, as shown in FIGS. 1A-1B. In these embodiments, an insulating fill material 2 may be formed to fill the hollow part surrounded by the semiconductor channel 1. The U-shaped pipe shape semiconductor channel 1 shown in FIG. 3 may alternatively be a hollow cylinder filled with an insulating fill material 2, shown in FIGS. 1A-1B.

The substrate 100 can be any semiconducting substrate known in the art, such as monocrystalline silicon, IV-IV compounds such as silicon-germanium or silicon-germanium-carbon, III-V compounds, II-VI compounds, epitaxial layers over such substrates, or any other semiconducting or non-semiconducting material, such as silicon oxide, glass, plastic, metal or ceramic substrate. The substrate 100 may include integrated circuits fabricated thereon, such as driver circuits for a memory device.

Any suitable semiconductor materials can be used for semiconductor channel 1, for example silicon, germanium, silicon germanium, or other compound semiconductor materials, such as III-V, II-VI, or conductive or semiconductive oxides, etc. The semiconductor material may be amorphous, polycrystalline or single crystal. The semiconductor channel material may be formed by any suitable deposition methods. For example, in one embodiment, the semiconductor channel material is deposited by low pressure chemical vapor deposition (LPCVD). In some other embodiments, the semiconductor channel material may be a recrystallized polycrystalline semiconductor material formed by recrystallizing an initially deposited amorphous semiconductor material.

The insulating fill material 2 may comprise any electrically insulating material, such as silicon oxide, silicon nitride, silicon oxynitride, or other high-k insulating materials.

The monolithic three dimensional NAND string further comprise a plurality of control gate electrodes 3, as shown in FIGS. 1A-1B, 2A-2B, and 3. The control gate electrodes 3 may comprise a portion having a strip shape extending substantially parallel to the major surface 100a of the substrate 100. The plurality of control gate electrodes 3 comprise at least a first control gate electrode 3a located in a first device level (e.g., device level A) and a second control gate electrode 3b located in a second device level (e.g., device level B) located over the major surface 100a of the substrate 100 and below the device level A. The control gate material may comprise any one or more suitable conductive or semiconductor control gate material known in the art, such as doped polysilicon, tungsten, copper, aluminum, tantalum, titanium, cobalt, titanium nitride or alloys thereof.

A blocking dielectric 7 is located adjacent to the control gate(s) 3 and may surround the control gate electrode 3. The blocking dielectric 7 may comprise a layer having plurality of blocking dielectric segments located in contact with a respective one of the plurality of control gate electrodes 3, for example a first dielectric segment 7a located in device level A and a second dielectric segment 7b located in device level B are in contact with control gate electrodes 3a and 3b, respectively, as shown in FIG. 3.

The monolithic three dimensional NAND string also comprise a plurality of discrete charge storage regions or segments 9 located between the blocking dielectric 7 and the channel 1. Similarly, the plurality of discrete charge storage regions 9 comprise at least a first discrete charge storage region 9a located in the device level A and a second discrete charge storage region 9b located in the device level B, as shown in FIG. 3.

The discrete charge storage regions 9 may comprise a plurality of vertically spaced apart, conductive (e.g., metal such as tungsten, molybdenum, tantalum, titanium, platinum, ruthenium, and alloys thereof, or a metal silicide such as tungsten silicide, molybdenum silicide, tantalum silicide, titanium silicide, nickel silicide, cobalt silicide, or a combination thereof), or semiconductor (e.g., polysilicon) floating gates, such as a floating gate comprising a layer of polysilicon or a layer of polysilicon with a thin layer of a high work function material 6 (e.g. a material with a higher work function than the polysilicon or amorphous silicon regions 9), such as ruthenium or titanium nitride, as shown in FIG. 4A.

The tunnel dielectric 11 of the monolithic three dimensional NAND string is located between each one of the plurality of the discrete charge storage regions 9 and the semiconductor channel 1.

The blocking dielectric 7 and the tunnel dielectric 11 may be independently selected from any one or more same or different electrically insulating materials, such as silicon oxide, silicon nitride, silicon oxynitride, or other insulating materials. The blocking dielectric 7 and/or the tunnel dielectric 11 may include multiple layers of silicon oxide, silicon nitride and/or silicon oxynitride (e.g., ONO layers) as illustrated in more detail below.

FIGS. 4A-4C illustrate a method of making a NAND string according to a first embodiment of the invention.

Referring to FIG. 4A, a stack 120 of alternating layers 19 (19a, 19b etc.) and 121 (121a, 121b, etc.) are formed over the major surface of the substrate 100. Layers 19, 121 may be deposited over the substrate by any suitable deposition method, such as sputtering, CVD, PECVD, MBE, etc. The layers 19, 121 may be 6 to 100 nm thick.

In this embodiment, the first layers 19 comprise any suitable sacrificial material, such as an electrically insulating material that may be selectively etched relative to the second layers 121. Any suitable insulating material may be used, such as silicon oxide, silicon nitride, silicon oxynitride, a high-k dielectric (e.g., aluminum oxide, hafnium oxide, etc. or an organic insulating material). The second layers 121 comprise a conducting or a doped semiconducting material that can function as a control gate electrode 3 of a NAND string. For example, layers 121 may comprise silicon, such as amorphous silicon or polysilicon, or another semiconductor material, such as a group IV semiconductor, including silicon-germanium and germanium. In an embodiment, layers 121 comprise p-type or n-type doped semiconductor materials, such as heavily doped materials. The term heavily doped includes semiconductor materials doped n-type or p-type to a concentration of above $10^{18}$ cm$^{-3}$. In contrast, lightly doped semiconductor materials have a doping concentration below $10^{18}$ cm$^{-3}$ and intrinsic semiconductor materials have a doping concentration below $10^{15}$ cm$^{-3}$.

The deposition of layers 19, 121, is followed by etching the stack 120 to form at least one a front side opening 81 in the stack 120. An array of front side openings 81 (e.g., memory holes) may be formed in locations where vertical channels of NAND strings will be subsequently formed. The openings 81 may be formed by photolithography and etching. The blocking dielectric (e.g., ONO or silicon oxide) 7, the charge storage layer 9, including an optional high work function material layer 6 (e.g. ruthenium or titanium nitride), the tunnel dielectric 11 and the channel layer 1 may then be deposited in the front side opening with processes known in the art, such as atomic layer deposition or chemical vapor deposition.

Next, as shown in FIG. 4B, an array of back side openings 84 are formed in the stack 120, such as by photolithography and etching. The back side openings may have an elongated trench shape, such as a slit trench shape. Then, the first layers 19 are removed via the back side openings 84 by selectively etching the first layers 19 compared to the second layers 121 to form back side recesses 62 in the stack 120 (i.e., in spaced previously occupied by the first layers 19a, 19b, etc). The back side recesses 62 may be formed by selective, isotropic wet etching or dry etching (e.g., by SiConi™ remote plasma assisted dry etching which involves the simultaneous exposure of a substrate to $H_2$, $NF_3$ and $NH_3$ plasma by-products) which selectively etches the first layer 19 compared to the second layer 121. Portions of blocking dielectric 7 exposed in the back side recesses 62 are also removed during the etching step to expose the charge storage layer 9 or the optional high work function layer 6 (if provided) in the back side recesses 62. The remaining second layers 121 form the control gate electrodes 3. The step of removing at least a portion of the first layers 19 leaves second material control gates 3 contacting the blocking dielectric layer 7 portions separated by the back side recesses 62.

Next, as illustrated in FIG. 4C, an oxidation step is performed. In this step, the exposed portions of the control gate electrodes 3 are oxidized. Further, the exposed portions of the charge storage layer 9 in the back side recess 62 are oxidized. Preferably, oxidation is performed until the exposed portions of the charge storage layer 9 are oxidized entirely through their thickness. That is, oxidation is performed until the oxidized portions 25 of the charge storage layer 9 extend to the tunnel dielectric 11. In this manner, the charge storage layer 9 is segmented to form a plurality of discrete charge storage regions or segments (e.g. 9a, 9b). In an embodiment, the exposed portion of the control gate electrodes 3 and the exposed portion of the charge storage layer in the back side recesses 62 are oxidized in the same oxidation step. If present, the exposed portions of the ruthenium layer 6 in the back side recess 62 also oxidize and are removed from the stack 120 via sublimation through the back side opening 84. For example, the oxidation may be conducted in two steps. In the first step, the exposed portions of the ruthenium layer 6 in the back side recess 62 are oxidized by oxygen plasma and are removed by sublimation. The exposed portions of the charge storage layer 9 are then oxidized in a second oxidation step.

Typically, the oxidized portions 25 of the charge storage layer 9 result in the charge storage regions 9a, 9b having concave boundaries with the oxidized portions 25 of the charge storage layer 9. That is, the boundaries of the discrete charge storage regions 9a, 9b may have a bird's peak shape 27. In other words, the concave boundaries are located on the horizontal portions of the regions 9a, 9b having a middle portion facing inward in each of the regions 9a, 9b. The outer portions of regions 9a, 9a protrude outwardly in the vertical direction and have a bird's beak shape having a flat surface joining a curved surface at a point or narrow tip, similar to the shape formed in a silicon substrate during the LOCOS process. Thus, the resulting first and second charge storage regions 9a, 9b each preferably comprise a silicon (e.g., polysilicon) region having the bird's beak shape and region of material 6 having a higher work function than the polysilicon region.

After forming the discrete charge storage regions 9a, 9b, the back side recesses 62 may be filled with an insulating material or left as air gap insulating regions.

The remaining steps to make a NAND string may be performed as taught in U.S. Pat. No. 8,349,681 or in U.S. application Ser. No. 14/133,979 filed on Dec. 19, 2013, both of which are incorporated herein by reference in their entirety.

FIGS. 5A-5D illustrate a method of making a NAND string according to another embodiment. In this embodiment, the electrically insulating first layers 19 comprise composite layers 19c (e.g., first and second composite layers 19ca, 19cb) that each include three layers, a first layer 31, a second layer 32 and a third layer 33. In an embodiment, the first layer 31 of the composite layer 19c comprises an oxide, such as $SiO_2$. The second layer 32 of the composite layer 19c comprises a nitride, such as $Si_3N_4$. The third layer 33 of the composite layer 19c comprises an oxide, such as $SiO_2$.

The method shown in FIG. 5A includes forming the front side openings 81 and deposition of the blocking dielectric (e.g., ONO) 7, the charge storage layer 9, the optional high work function material layer 6, the tunnel dielectric 11 and the channel layer 1 into each of the front side openings 81, similar to the steps described above with respect to FIG. 4A. Then, as illustrated in FIG. 5B, back side openings 84 are formed in the stack 120, such as by photolithography and etching. Next, the second layer 32 of the composite layer 19c is selectively removed, such as by selective etching (e.g., using hot $H_3PO_4$ etch), to form a back side recess 62 between the first and third layers 31, 33 of the composite layer 19c. Preferably, selective etching of the second layer 32 is performed until the blocking dielectric 7 is reached. The first and third layers 31, 33 of the composite layer 19c protect the exposed surfaces of the second layers 121 that will form the control gate electrodes 3. In this manner, a back side recess 62 with a high aspect ratio (length to width) can be fabricated without excess thinning of the second layers 121.

As illustrated in FIG. 5C, after the second layer 32 is selectively removed, the first and third layers 31, 33 are removed (e.g., by selective etching), thereby widening the back side recess 62. Additionally, as illustrated in FIG. 5C, portions of the blocking dielectric 7 (e.g., of the oxide-nitride-oxide blocking dielectric) located between the second layers 121 and exposed in the back side openings 62 are removed. After removing the first and third layers 31, 33 and the portions of the blocking dielectric 7 located between the second layers, the exposed portions of the second layers 121 (which form the control gate electrodes 3) are preferably coated with a protective layer 35 to protect the control gate electrodes 3 during further processing. In an embodiment, the exposed second layers 3/121 are coated with silicon nitride layer 35. If the second layers 3/121 comprise heavily doped silicon (e.g., polysilicon), the silicon nitride layer 35 may be formed by reacting the exposed silicon with nitrogen. In this step, the second layers 3/121 may be thinned slightly. However, this thinning is less than that which results from the method steps illustrated in FIGS. 4B-4C. If desired, the protective layer 35 may be omitted, and the second layers 121 may be thicker than the first layer 19 to allow for some thinning of the second layers 121 during the blocking dielectric 7 etching steps.

If the blocking dielectric 7 comprises an oxide-nitride-oxide composite dielectric, then the above described etching and coating steps may be carried out sequentially as follows. First, the outer oxide layer (i.e., the layer facing the control gate electrodes 3) and the nitride layer of the blocking dielectric layer and the silicon oxide layers 31, 33 of the composite layer 19 are etched away in a first etching step after removing the silicon nitride layer 32 of the composite layer 19. Then, the protective silicon nitride layer 35 is formed on portions of the second material layers 3/121 exposed in the back side recesses 62. This is followed by a second etching step to remove the inner oxide layer (i.e., the layer facing the charge storage layer 9) of the blocking dielectric 7.

In the step illustrated in FIG. 5D, portions of the charge storage layer 9, including the high work function material layer 6, if present, are exposed to oxygen. As discussed above, ruthenium forms a volatile species (i.e., it ruthenium sublimates) which is removed via back side openings 84. Further, as in the previous embodiment, the charge storage layer 9 is oxidized entirely through its thickness to form discrete charge storage regions (e.g., intrinsic or low doped floating gates) 9a, 9b. As discussed above, the oxidized portions 25 of the charge storage layer 9 result in the charge storage regions 9a, 9b having concave boundaries with the oxidized portions 25 of the charge storage layer 9. That is, the boundaries of the discrete charge storage regions 9a, 9b may have a bird's peak shape 27. The protective layer 35 protects the control gate electrodes 3 from thinning during the oxidation step. The method illustrated in FIGS. 5A-5D leaves the protective layer 35 located on portions of the control gate electrodes 3 not in contact with the blocking dielectric 7 (i.e., on the top, bottom and back sides of the control gate electrodes 3).

The discrete charge storage regions 9a, 9b may be formed by either oxidation of portions of the charge storage layer 9 exposed in the back side recesses 62, as described above, or by etching the portions of the charge storage layer 9 exposed in the back side recesses 62, as will be described below with respect to FIGS. 6A-6D.

FIGS. 6A-6D illustrate a method of forming a NAND string according to another embodiment in which the step of forming the discrete charge storage regions comprises removing portions of the charge storage layer 9 exposed in the back side recesses 62 by etching.

As illustrated in FIG. 6A, in this embodiment, as in the previous embodiment, the composite layer 19c includes three layers described above: the first (e.g., silicon oxide) layer 31, the second (e.g., silicon nitride) layer 32 and the third (e.g., silicon oxide) layer 33. However, in this embodiment, the first layers 19 (e.g., 19a, 19b) may comprise polysilicon or amorphous silicon heavily doped with at least one of carbon or boron. The concentration of carbon or boron may be in the range of $10^{19}$ to $10^{21}$ atoms/cm$^3$.

As illustrated in FIG. 6B, the second layer 32 is selectively removed from the composite layer 19c to form the back side recesses 62, as described above. Then, as illustrated in FIG. 6C, the first and third layers 31, 33 are removed, thereby increasing the width of the back side recess 62. Portions of the blocking dielectric 7 exposed in the back side recesses 62 are also removed during the etching step. If layer 6 is present, then the portions of layer 6 exposed in the back side recesses 62 may be removed by ashing using oxygen plasma.

As illustrated in FIG. 6C, the exposed portions of the second layers 121 are not coated with a protective layer 35. However, as in the previous embodiment, the exposed portions of the second layers 121 may be coated with a protective layer 35 if desired.

FIG. 6D illustrates the next step in the method. In this embodiment, rather than forming oxidized portions 25 in the charge storage layer 9 to form discrete charge storage regions 9a, 9b as in the previous embodiment, exposed regions of the charge storage layer 9 in the back side recesses 62 are removed by selective etching. Preferably, the charge storage layer 9 is etched entirely through its thickness as illustrated in FIG. 6D to form discrete charge storage regions 9a, 9b separated by air gaps 29.

In this embodiment, the polysilicon or amorphous silicon layers 121 are doped with at least one of carbon or boron, while the charge storage layer 9 is not doped with carbon or boron. Carbon doping reduces polysilicon grain size and results in fewer voids. Layer 9 may be intrinsic or lightly doped with an n-type dopant, such as arsenic or phosphorus. The different doping characteristics of layers 121 and 9 allow layer 9 to be selectively etched compared to layers 121. For example, to the intrinsic polysilicon of layer 9 etches faster than the C and/or B doped polysilicon or amorphous silicon of layers 121 when EDP (ethylenediamine pyrocatechol) is used as the etching liquid during the selective etching of layer 9 to form discreet floating gates 9a, 9b.

Although the foregoing refers to particular preferred embodiments, it will be understood that the invention is not so limited. It will occur to those of ordinary skill in the art that various modifications may be made to the disclosed embodiments and that such modifications are intended to be within the scope of the invention. All of the publications, patent applications and patents cited herein are incorporated herein by reference in their entirety.

What is claimed is:

1. A method of making a monolithic three dimensional NAND string, comprising:

forming a stack of alternating layers of a first material and a second material over a substrate, wherein the first material comprises an electrically insulating material and wherein the second material comprises a semiconductor or conductor material;

etching the stack to form a front side opening in the stack;

forming a blocking dielectric layer over the stack of alternating layers of a first material and a second material exposed in the front side opening;

forming a semiconductor or metal charge storage layer over the blocking dielectric;

forming a tunnel dielectric layer over the charge storage layer;

forming a semiconductor channel layer over the tunnel dielectric layer;

etching the stack to form a back side opening in the stack;

removing at least a portion of the first material layers and portions of the blocking dielectric layer through the back side opening to form back side recesses between the second material layers; and oxidizing regions of the charge storage layer adjacent the back side recesses to form discrete charge storage regions, wherein at least one feature selected from a group consisting of five features is employed to make the monolithic three dimensional NAND string; and the group of five features consists of:

a first feature wherein oxidizing regions of the charge storage layer also oxidizes surfaces of the second material exposed in the back side recesses;

a second feature wherein the blocking dielectric layer comprises a layer of silicon nitride between layers of silicon oxide;

a third feature wherein the method further comprises forming a protective layer over exposed portions of the second layer in the back side recesses after forming the back side recesses;

a fourth feature wherein the method further comprises forming a layer of material having a higher work function than the semiconductor or metal charge storage layer over the blocking dielectric prior to forming the charge storage layer; and a fifth feature wherein the discrete charge storage regions comprise floating gates having concave boundaries with oxidized semiconductor or metal regions of the charge storage layer, and the second material comprises polysilicon or amorphous silicon, and the polysilicon or the amorphous silicon is doped with at least one of carbon or boron and the floating gates comprise intrinsic polysilicon that etches faster than the doped polysilicon or doped amorphous silicon second material.

2. The method of claim 1, wherein the layers of a first material comprises composite layers comprising a layer of silicon nitride between layers of silicon oxide.

3. The method of claim 1, further comprising filling the back side recesses with an insulating material.

4. The method of claim 1, wherein removing at least a portion of the first material layers leaves second material control gates contacting the blocking dielectric layer portions separated by the back side recesses.

5. The method of claim 1, wherein the first feature is employed to make the monolithic three dimensional NAND string.

6. The method of claim 1, wherein the second feature is employed to make the monolithic three dimensional NAND string.

7. The method of claim 1, wherein the discrete charge storage regions comprise floating gates having concave boundaries with oxidized semiconductor or metal regions of the charge storage layer.

8. The method of claim 7, wherein portions of the concave boundaries of the discrete charge storage regions comprise a bird's peak shape.

9. The method of claim 7, wherein the second material comprises polysilicon or amorphous silicon.

10. The method of claim 1, wherein the fifth feature is employed to make the monolithic three dimensional NAND string.

11. The method of claim 10, wherein a concentration of the at least one of carbon or boron is in the range of $10^{19}$ to $10^{21}$ atoms/cm$^3$.

12. The method of claim 1, wherein the third feature is employed to make the monolithic three dimensional NAND string.

13. The method of claim 12, wherein the protective layer comprises silicon nitride.

14. The method of claim 1, wherein the fourth feature is employed to make the monolithic three dimensional NAND string.

15. The method of claim 14, further comprising removing at least a portion of the layer of material having the higher work function through the back side opening.

16. The method of claim 15, wherein the layer of higher work function material comprises a ruthenium or titanium nitride layer.

17. The method of claim 16, wherein the least a portion of the ruthenium layer removed is removed by oxidation and sublimation.

18. A method of making a monolithic three dimensional NAND string, comprising:

forming a stack of alternating first and second layers over a substrate, wherein the first layers comprise an electrically insulating composite layer comprising a silicon nitride layer between silicon oxide layers and wherein the second layers comprise a semiconductor or conductor material;

etching the stack to form a front side opening in the stack;

forming a blocking dielectric layer over the stack of alternating first and second layers exposed in the front side opening;

forming a charge storage layer over the layer of high work function material;

forming a tunnel dielectric layer over the charge storage layer;

forming a semiconductor channel layer over the tunnel dielectric layer;

etching the stack to form a back side opening in the stack;

removing at least a portion of the silicon nitride layer between silicon oxide layers to form back side recesses between adjacent second layers;

removing portions of the blocking dielectric layer exposed in the back side recesses; and forming discrete charge storage regions, wherein at least one feature selected from a group consisting of six features is employed to make the monolithic three dimensional NAND string; and the group of six features consists of:
a first feature wherein the charge storage layer comprises a semiconductor, metal or silicide charge storage layer and the method further comprises forming a layer of material having a work function higher than the semiconductor metal or silicide charge storage layer over the blocking dielectric layer prior to forming the charge storage layer;
a second feature wherein the charge storage layer comprises intrinsic polysilicon and the charge storage regions comprise floating gates;
a third feature wherein the step of forming the discrete charge storage regions comprises oxidizing the charge storage layer material exposed in the back side recesses, wherein the discrete charge storage regions comprise concave boundaries located perpendicular to the tunnel dielectric layer;
a fourth feature wherein the step of forming the discrete charge storage regions comprises removing portions of the charge storage layer exposed in the back side recesses by etching;
a fifth feature wherein wherein the layers of silicon oxide in the composite layer protect the second material when removing at least a portion of the silicon nitride layer between silicon oxide layers; and
a sixth feature wherein the blocking dielectric layer comprises a silicon nitride layer located between a first silicon oxide layer and a second silicon oxide layer, and wherein the method further comprises:
removing the first oxide layer and the nitride layer of the blocking dielectric layer and the silicon oxide layers of the composite layer after removing the silicon nitride layer of the composite layer;
forming a protective layer on portions of the second material layers exposed in the back side recesses;
removing the second oxide layer of the blocking dielectric; and
forming the discrete charge storage regions by etching or oxidation of portions of the charge storage layer exposed in the back side recesses.

19. The method of claim 18, wherein the first feature is employed to make the monolithic three dimensional NAND string.

20. The method of claim 19, further comprising removing the layers of silicon oxide of the composite layer and the layer of higher work function material exposed in the back side recesses.

21. The method of claim 19, wherein the layer of higher work function material comprises ruthenium or titanium nitride and the tunnel dielectric comprises silicon oxide.

22. The method of claim 18, wherein the second feature is employed to make the monolithic three dimensional NAND string.

23. The method of claim 18, wherein the third feature is employed to make the monolithic three dimensional NAND string.

24. The method of claim 23, wherein a portion of the concave boundaries of the discrete charge storage regions comprise a bird's peak shape.

25. The method of claim 18, wherein the fourth feature is employed to make the monolithic three dimensional NAND string.

26. The method of claim 25, wherein the second layers comprise polysilicon or amorphous silicon doped with at least one of carbon or boron, the charge storage layer comprises intrinsic polysilicon, and the second material layers are etched at a lower rate than the charge storage layer during the step of forming the discrete charge storage regions.

27. The method of claim 18, wherein the fifth feature is employed to make the monolithic three dimensional NAND string.

28. The method of claim 18, wherein the blocking dielectric layer comprises a silicon nitride layer located between a first silicon oxide layer and a second silicon oxide layer.

29. The method of claim 18, the sixth feature is employed to make the monolithic three dimensional NAND string.

30. A method of making a monolithic three dimensional NAND string, comprising:
forming a stack of alternating layers of a first material and a second material over a substrate, wherein the first material comprises an electrically insulating material and wherein the second material comprises a semiconductor or conductor material;
etching the stack to form a front side opening in the stack;
forming a blocking dielectric layer over the stack of alternating layers of a first material and a second material exposed in the front side opening;
forming a charge storage layer over the blocking dielectric;
forming a tunnel dielectric layer over the charge storage layer;
forming a semiconductor channel layer over the tunnel dielectric layer;
etching the stack to form a back side opening in the stack;
removing at least a portion of the first material layers through the back side opening to form back side recesses between the second material layers;
forming a protective layer on portions of the second material layers exposed in the back side recesses;
after forming the protective layer, removing portions of the blocking dielectric layer exposed in the back side the recesses through the back side opening; and
forming discrete charge storage regions.

31. The method of claim 30, wherein the protective layer comprises a silicon nitride layer.

32. The method of claim 30, wherein:
the blocking dielectric layer comprises a silicon nitride layer located between a first silicon oxide layer and a second silicon oxide layer; and
the first layers comprise an electrically insulating composite layer comprising a silicon nitride layer between silicon oxide layers.

33. The method of claim 32, further comprising:
removing the silicon nitride layer of the composite layer;
before the step of forming the protective layer, removing the first oxide layer and the nitride layer of the blocking dielectric layer and the silicon oxide layers of the composite layer;
after the step of forming the protective layer, removing the second oxide layer of the blocking dielectric; and
forming the discrete charge storage regions by etching or oxidation of portions of the charge storage layer exposed in the back side recesses.

* * * * *